(12) United States Patent
Granahan (10) Patent No.: US 9,245,754 B2
(45) Date of Patent: Jan. 26, 2016

(54) SIMPLIFIED CHARGE BALANCE IN A SEMICONDUCTOR DEVICE

(71) Applicant: Mark E. Granahan, Allentown, PA (US)

(72) Inventor: Mark E. Granahan, Allentown, PA (US)

( * ) Notice: Subject to any disclaimer, the term of this patent is extended or adjusted under 35 U.S.C. 154(b) by 0 days.

(21) Appl. No.: 14/289,628

(22) Filed: May 28, 2014

(65) Prior Publication Data

US 2015/0348784 A1 Dec. 3, 2015

(51) Int. Cl.
| | |
|---|---|
| *H01L 21/336* | (2006.01) |
| *H01L 21/20* | (2006.01) |
| *H01L 21/26* | (2006.01) |
| *H01L 29/74* | (2006.01) |
| *H01L 29/80* | (2006.01) |
| *H01L 21/225* | (2006.01) |
| *H01L 29/10* | (2006.01) |
| *H01L 21/324* | (2006.01) |

(52) U.S. Cl.
CPC ............ *H01L 21/225* (2013.01); *H01L 21/324* (2013.01); *H01L 29/1095* (2013.01)

(58) Field of Classification Search
CPC . H01L 21/8249; H01L 21/268; H01L 21/324; H01L 21/8222; H01L 21/26586; H01L 21/67115; H01L 21/8224; H01L 29/7809; H01L 29/66666; H01L 29/7827; H01L 29/866; H01L 27/1021; H01L 27/24
USPC ......... 438/206, 212, 237, 269, 308, 328, 336, 438/378, 795
See application file for complete search history.

(56) References Cited

U.S. PATENT DOCUMENTS

| | | | |
|---|---|---|---|
| 4,754,310 A | 6/1988 | Coe | |
| 5,216,275 A | 6/1993 | Chen | |
| 5,438,215 A | 8/1995 | Tihanyi | |
| 6,271,562 B1 | 8/2001 | Deboy et al. | |
| 6,630,698 B1 | 10/2003 | Deboy et al. | |
| 6,639,272 B2 | 10/2003 | Ahlers et al. | |
| 6,667,514 B2 | 12/2003 | Ahlers et al. | |
| 6,713,813 B2 | 3/2004 | Marchant | |
| 6,982,459 B2 | 1/2006 | Suzuki et al. | |
| 7,601,603 B2 | 10/2009 | Yamauchi et al. | |

(Continued)

OTHER PUBLICATIONS

Steven M. George, "Atomic Layer Deposition: An Overview," Chemical Reviews, 2010, Nov. 30, 2009, pp. 111-131, vol. 110, No. 1, American Chemical Society.

(Continued)

*Primary Examiner* — Hsien Ming Lee
(74) *Attorney, Agent, or Firm* — Otterstedt, Ellenbogen & Kammer, LLP (57) ABSTRACT

A method of forming a charge balance region in an active semiconductor device includes: forming an epitaxial region including material of a first conductivity type on an upper surface of a substrate of the semiconductor device; forming multiple recessed features at least partially through the epitaxial region; depositing a film comprising material of a second conductivity type on a bottom and/or sidewalls of the recessed features using atomic layer deposition; and performing thermal processing such that at least a portion of the film deposited on the bottom and/or sidewalls of each of the recessed features forms a region of the second conductivity type in the epitaxial layer which follows a contour of the recessed features, the region of the second conductivity type, in conjunction with the epitaxial layer proximate the region of the second conductivity type, forming the charge balance region.

28 Claims, 5 Drawing Sheets

(56) References Cited

U.S. PATENT DOCUMENTS

| | | | |
|---|---|---|---|
| 7,679,146 | B2 | 3/2010 | Tu et al. |
| 7,868,384 | B2 | 1/2011 | Lee et al. |
| 7,964,913 | B2 | 6/2011 | Darwish |
| 8,344,451 | B2 | 1/2013 | Darwish |
| 8,399,921 | B2 | 3/2013 | Tu |
| 8,525,260 | B2 | 9/2013 | Li et al. |
| 8,580,664 | B2 | 11/2013 | Clark |
| 2009/0085101 | A1 | 4/2009 | Huang et al. |
| 2010/0059849 | A1* | 3/2010 | Quddus ............... 257/476 |
| 2011/0084333 | A1* | 4/2011 | Disney et al. ......... 257/330 |
| 2013/0043468 | A1 | 2/2013 | Adekore |

OTHER PUBLICATIONS

D.W. McNeill et al., "Atomic Layer Deposition of Hafnium Oxide Dielectrics on Silicon and Germanium Substrates," J Mater Sci: Mater Electron (2008) 19, Jul. 6, 2007, pp. 119-123, Springer Science and Business Media, LLC.

Bodo Kalkofen et al., "P-type Doping of Silicon Suitable for Structures with High Aspect Ratios by Using a Dopant Source of Boron Oxide Grown by Atomic Layer Deposition," ECS Transactions, 2012, vol. 45, No. 6, pp. 55-67, The Electrochemical Society.

Bart Vermang, "Aluminum Oxide as Negatively Charged Surface Passivation for Industrial Crystalline Silicon Solar Cells," University of Leuven, Science, Engineering and Technology Group, Jun. 2012, pp. 1-159, Interuniversity Microelectronics Centre (Imec).

R. Kotipalli et al., "Passivation Effects of Atomic-Layer-Deposited Aluminum Oxide," EPJ Photovoltaics 4, 45107 (2013), Sep. 27, 2013, pp. 1-8.

G. Dingemans et al., "Status and Prospects of Al2O3-based Surface Passivation Schemes for Silicon Solar Cells," J. Vac. Sci. Technol. A 30(4), 040802, Jul./Aug. 2012, pp. 1-27, American Vacuum Society.

P.M. Shenoy et al., "Analysis of the Effect of Charge Imbalance on the Static and Dynamic Characteristics of the Super Junction MOSFET," The 11th International Symposium on Power Semiconductor Devices and ICs (1999), May 1999, pp. 99-102, IEEE ISPSD '99 Proceedings.

International Search Report and Written Opinion of the International Searching Authority for counterpart Application No. PCT/US15/32360, Aug. 12, 2015.

* cited by examiner

SIMPLIFIED CHARGE BALANCE IN A SEMICONDUCTOR DEVICE

TECHNICAL FIELD

The present invention relates generally to electrical and electronic circuitry, and more particularly relates to semiconductor devices and the fabrication thereof.

BACKGROUND

Semiconductor devices, including, but not limited to, metal-oxide-semiconductor field-effect transistors (MOSFETs), insulated gate bipolar transistors (IGBTs), and diodes, are well known in the art, as are the various applications in which such devices can be employed. Exemplary applications in which semiconductor devices are used include communications systems (e.g., radio frequency (RF) and microwave), automotive electronics, power supplies, high-voltage motors, etc. As a simplistic view, semiconductor devices include a body region, typically formed of a single conductivity type, and means for forming a depletion region (also referred to as a depletion layer) throughout at least a portion of the body. The depletion layer may be formed by applying a positive voltage, $V_{GB}$, between a gate, or other control terminal, and the body of the device. This gate-body voltage forces positively charged holes away from an interface between the semiconductor and a gate-insulator, thus leaving exposed a carrier-free region of immobile, negatively charged acceptor ions. If the applied gate-body voltage is high enough, a high concentration of negative charge carriers forms in an inversion layer located in a shallow layer proximate the gate-insulator/semiconductor interface for conducting a current through the device.

At least a portion of the body region (e.g., a drain region) may be operated as a drift region for transferring charge carriers due, at least in part, to the effect of an electric field in the semiconductor device when the device is operated in the ON mode. When the device is in the OFF mode, on the other hand, this drift region effectively becomes a depletion region to reduce an electric field strength applied thereon, resulting in an increase in breakdown voltage in the device. The drift region is designed to support a high blocking voltage.

Two important electrical parameters which are often used to characterize the performance of a semiconductor device, particularly power semiconductor devices, are breakdown voltage and on-state resistance, also referred to as on-resistance. Breakdown voltage, $V_{BD}$, is a parameter of a P-N junction (e.g., in a diode, transistor, etc.) that often defines the largest reverse voltage that can be applied without causing an exponential increase in current flowing through the junction, ultimately damaging the device. On-state resistance, $R_{DSon}$, of a field-effect transistor (FET) device generally refers to the internal resistance of the device when the device is in its fully conducting (i.e., "on") state.

For certain applications, such as, but not limited to, power applications, it is generally desirable for a transistor device to have as high a breakdown voltage and as low an on-state resistance as possible. However, breakdown voltage and on-state resistance are mutually exclusive properties of a conventional semiconductor device, since increasing the breakdown voltage rating, for example by incorporating a thicker and lower doped drift region, undesirably leads to higher on-state resistance. Conversely, increasing the doping density in the drift region to thereby reduce the on-state resistance undesirably leads to lower breakdown voltage in the device.

A common method that is well documented in the literature for increasing breakdown voltage in a device without significantly increasing on-resistance involves designing the drift region of the semiconductor device to include a charge balance region, also commonly referred to as a super junction structure or a charge balanced structure. The drift region in a charge balanced semiconductor device is enhanced by extending the depletion region into two dimensions. Conventional methods for fabricating a charge balance structure, however, have substantial disadvantages associated therewith.

SUMMARY OF THE INVENTION

In accordance with an embodiment of the invention, a method of forming a charge balance region in a semiconductor device includes: forming an epitaxial region including material of a first conductivity type on an upper surface of a substrate of the semiconductor device; forming recessed features at least partially through the epitaxial region; depositing a film including material of a second conductivity type on at least sidewalls of the recessed features using atomic layer deposition; and performing thermal processing such that at least a portion of the film deposited on each of the sidewalls of the recessed features forms a region of the second conductivity type in the epitaxial layer which follows a contour of the recessed features.

In accordance with another embodiment of the invention, a method of forming a charge balance region in a semiconductor device includes: forming an epitaxial region including material of a first conductivity type on an upper surface of a substrate of the semiconductor device; forming recessed features at least partially through the epitaxial region; depositing a film including material of a second conductivity type on at least sidewalls of the recessed features using atomic layer deposition, the material of the second conductivity type having a net static charge of a second charge type associated therewith; and performing thermal processing in such a manner that at least a portion of free charge carriers in the epitaxial region migrate towards the deposited film to thereby form the charge balance region in the epitaxial layer proximate the recessed features, the charge balance region following a contour of the recessed features.

In accordance with yet another embodiment of the invention, a semiconductor device includes a substrate, an epitaxial region of a first conductivity type formed on a surface of the substrate, and a plurality of recessed features formed at least partially through the epitaxial region. At least sidewalls of the recessed features have deposited thereon, using atomic layer deposition, a film comprising material of a second conductivity type. The semiconductor device further includes a charge balance region formed in the epitaxial layer proximate the recessed features. The charge balance region includes at least a portion of the film deposited on at least the sidewalls of the recessed features, the charge balance region following a contour of the recessed features.

Additional and/or other embodiments of the invention are described in the following detailed description, including the claims, which is to be read in connection with the accompanying drawings.

BRIEF DESCRIPTION OF THE DRAWINGS

The following drawings are presented by way of example only and without limitation, wherein like reference numerals (when used) indicate corresponding elements throughout the several views, and wherein.

It is to be appreciated that the drawings described herein are presented for illustrative purposes only. Moreover, common but well-understood elements and/or features that may be useful or necessary in a commercially feasible embodiment may not be shown in order to facilitate a less hindered view of the illustrated embodiments.

DETAILED DESCRIPTION OF PREFERRED EMBODIMENTS

Embodiments of the invention will be described herein in the context of illustrative semiconductor fabrication methods and devices, which utilize atomic layer deposition (ALD) in the formation of a charge balance region in a semiconductor device. Specifically, in one or more embodiments, recessed features are formed in a body region of the device, and one or more exposed surfaces (e.g., sidewalls and a bottom wall) of the recessed features are conformally coated with a film using ALD. The film comprises a material of a conductivity type which is opposite a conductivity type of the epitaxial region. During thermal processing, according to one or more embodiments, at least a portion of the film deposited on the surfaces of the recessed features out-diffuses from the recessed features into the epitaxial region and forms a charge balance region in the device, which follows a contour of the recessed features. Because of the high aspect ratio of the recessed features according to one or more embodiments, the recessed features can be formed having a reduced pitch (i.e., spacing between adjacent recessed features), thus enabling the doping density of the P and N regions to be increased to thereby reduce on-resistance in the body region without reducing breakdown voltage of the device.

It should be understood that embodiments of the invention are not limited to these or any other particular semiconductor fabrication method(s) and/or semiconductor devices. Rather, embodiments of the invention are more broadly applicable to techniques for beneficially creating a charge balance region in a semiconductor device. It should also be understood that the embodiments of the invention are not limited to a vertical power semiconductor device, rather embodiments of the invention are also applicable to, for example, other power devices, planar gate devices, lateral power devices, N-channel devices, P-channel devices, lateral semiconductor devices, insulated gate bipolar transistors (IGBTs), diodes, bipolar junction transistors (BJTs), enhancement mode devices, depletion mode devices, and the like. Similarly, the technology described herein is applicable to devices with either N-type substrate materials and/or P-type substrate materials. Accordingly, it will become apparent to those skilled in the art given the teachings herein that numerous modifications can be made to the illustrative embodiments shown that are within the scope of the claimed invention. That is, no limitations with respect to the embodiments shown and described herein are intended or should be inferred.

Various semiconductor fabrication techniques have been used in an attempt to increase breakdown voltage in a transistor device without significantly increasing on-resistance. Illustrative techniques for increasing breakdown voltage in a device include the use of exotic materials (e.g., silicon carbide and gallium nitride) in the semiconductor processing, which is commercially prohibitive due primarily to cost, and using a super-junction structure. The super-junction structure, pioneered by Infineon Technologies based on U.S. Pat. No. 4,754,310 to David Coe, the disclosure of which is incorporated by reference herein, is one method of commercially fabricating high-voltage transistor devices.

Figure 1A:
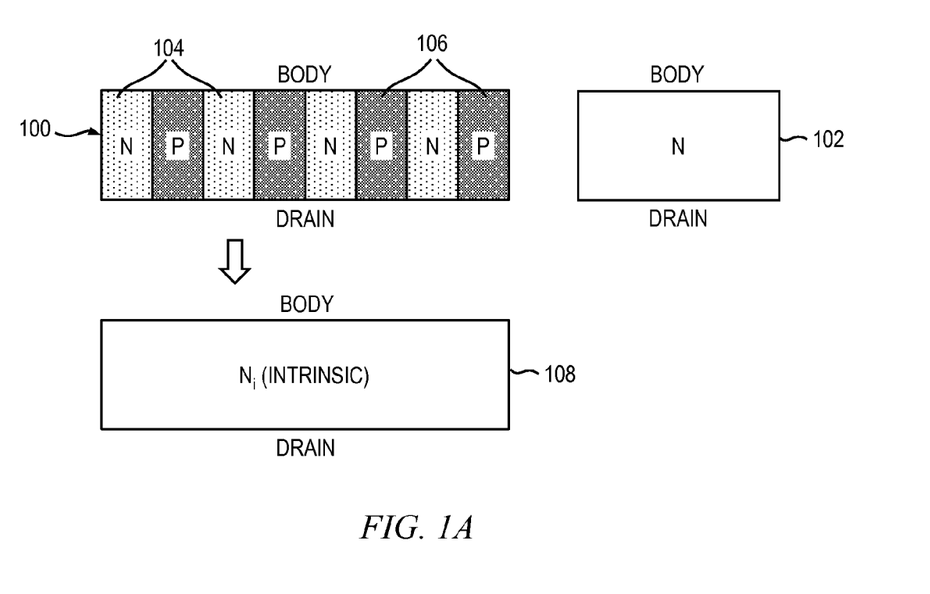
FIGS. 1A and 1B are top plan views conceptually depicting at least a portion of a drift layer in an illustrative super-junction structure.

The super junction concept, in one aspect, involves using multiple N-type doped epitaxial layers grown with subsequent ion implantation of P-type material between epitaxial growth steps to form alternating columns of N-type and P-type material. FIG. 1A illustrates classic alternating columns of N-type and P-type material resulting in a two-dimensional field. A common method of manufacturing a charge balance region involves the growth of multiple epitaxial layers followed by ion implantation to form alternating columns of N-type and P-type material (commonly referred to as a multiple-layer epitaxial growth, or multi-epi, implant method). Specifically, with reference to FIG. 1A, a top plan view depicts at least a portion of a drift layer 100 in an illustrative super junction structure. The drift layer 100 is formed having a plurality of alternating N-type pillars 104 and P-type pillars 106. By interleaving high aspect ratio regions of N and P layers 104 and 106, a space charge formed in these regions by depletion is substantially balanced and does not exceed a critical value for avalanche breakdown. When compared with a conventional N-type intrinsic drift layer 102, both the conventional drift layer and the super junction drift layer 100 are fully depleted, and thus the super-junction drift layer behaves macroscopically like an intrinsic region 108. In this effective intrinsic region 108, electric field, E, is substantially constant, and therefore breakdown voltage is proportional to electric field times a length, L, of the drift layer (i.e., BV=E·L). Since on-resistance is proportional to the length L of the drift layer, the on-resistance will be proportional to breakdown voltage (i.e., $R_{ON} \sim BV$).

Figure 1B:
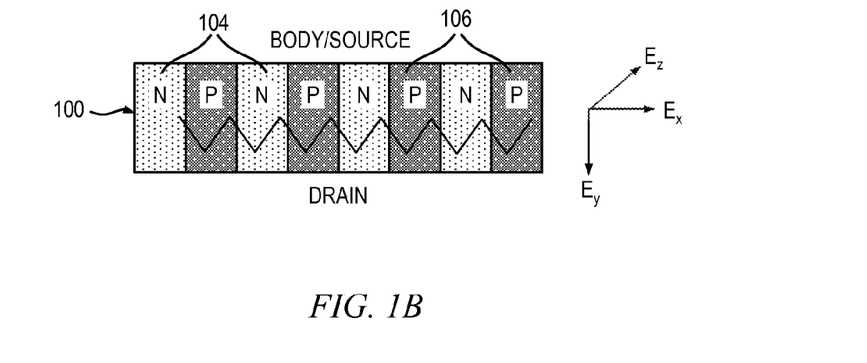

FIG. 1B conceptually depicts electric field distribution in the super-junction drift layer 100. As apparent from FIG. 1B, each vertical P-N junction (between an adjacent N-type pillar 104 and P-type pillar 106) creates a lateral field in the depleted region transverse to a direction of increasing potential. It is to be understood that charge and field must obey Gauss's Law, and therefore the following expression holds:

$$\nabla \vec{E} = \frac{dE_x}{dx} + \frac{dE_y}{dy} + \frac{dE_z}{dz} = \frac{q}{\varepsilon_{Si}}(N_D - n + p - N_A)$$

where $\nabla \vec{E}$ is the divergence of the electric field, $E_x$, $E_y$ and $E_z$ are the x, y and z components, respectively, of the electric field, q is point charge, $\varepsilon_{Si}$ is the electric constant for silicon, $N_D$ is the number of donor carriers, and $N_A$ is the number of acceptor carriers. Depending upon the value of the lateral field slopes, the slope of the vertical field may either increase or decrease, thereby changing the potential that the device can support. The strong coupling of breakdown voltage and charge is broken because of the presence of the lateral field created by the geometric arrangement of the N and P regions 104 and 106, respectively.

Figure 2:
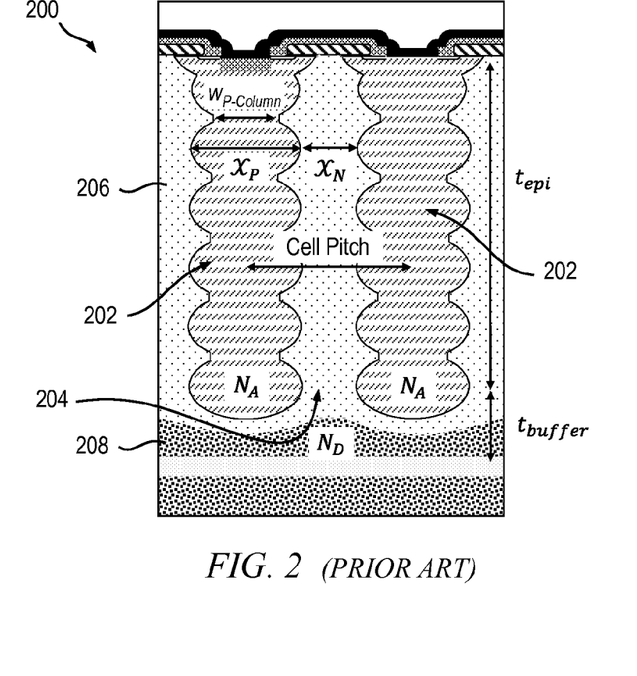
FIG. 2 is a cross-sectional view depicting at least a portion of a conventional super-junction structure formed using a multiple-epitaxial (i.e., multi-epi) implant methodology.

FIG. 2 is a cross-sectional view depicting at least a portion of a conventional super-junction device 200. The super junction device 200 is fabricated using multiple N-type epitaxial layers, with ion implantation of boron between epitaxial growth steps to create alternating P-type columns 202 and N-type regions 204 between the P-type columns; of note are the scallop features on the sidewalls of the columns 202 which are an artifact of the process. The P-type columns 202 have a lateral width, $w_{P-Column}$, associated therewith. Likewise, the N-type regions 204 have a lateral width, $x_n$, associated therewith. With reference to FIG. 2, $t_{epi}$ represents a thickness of N-type epitaxial layer 206, in a vertical dimension, and $t_{buffer}$ represents a vertical thickness of a buffer layer 208 in the super junction device 200. The buffer layer 208 functions to provide electrical isolation between a bottom of the columns and a substrate.

As a result of out-diffusion of the implanted boron, an effective width of the P-type columns 202 will increase to $x_p$, which places a practical limitation on minimum pitch (i.e., center-to-center spacing between adjacent columns of the same conductivity type) of the super-junction device 200, which thereby prevents scaling. This increased pitch undesirably results in increased on-resistance in the device. As an added disadvantage, the multi-epi implant method used to form the device 200 suffers from very long process times and high cost due to the many manufacturing steps that are involved, and thus presents high-volume manufacturing challenges.

Figure 3:
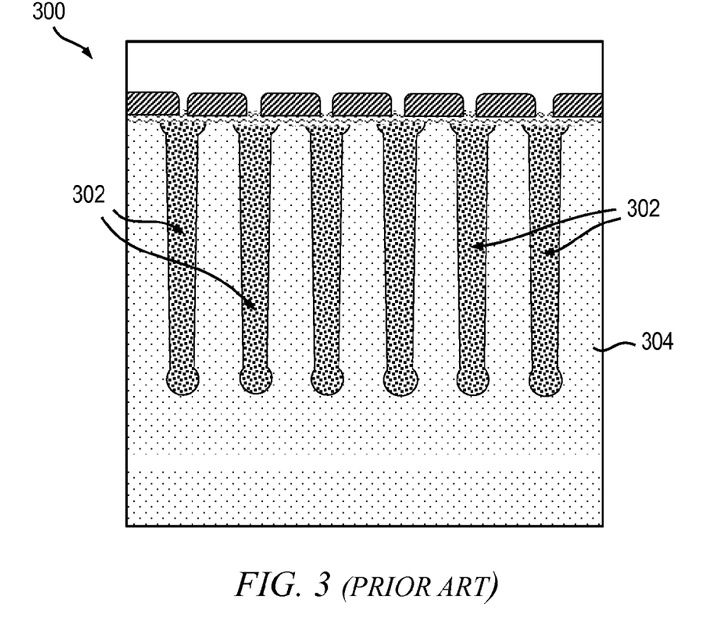
FIG. 3 is a cross-sectional view depicting at least a portion of conventional super-junction structure formed using a trench refill methodology.

An alternative method of manufacturing a charge balance region is shown in FIG. 3, which involves forming deep trenches 302 in an N-type drift region 304 of a semiconductor device 300, followed by trench refill with P-type silicon, commonly referred to as a trench refill fabrication method. Of note in FIG. 3 are the tapered sidewalls of the trenches 302 which are necessary for acceptable trench refill; this sidewall tapering results in an increased spacing between adjacent trenches which impacts density. Furthermore, while this method reduces the number of required fabrication steps compared to the multi-epi implant method used to form the device 200 shown in FIG. 2, the trench refill method suffers from a high defect rate attributable to void formation and slip dislocations, among other factors, inherent in the trench refill process itself.

Various semiconductor fabrication techniques have been used in an attempt to develop a charge balance region but either suffer from high cost associated with long manufacturing times or suffer from high defect rates associated with their respective process methods. For example, as previously explained, both the multi-epi implant and trench refill fabrication methods illustrated in FIGS. 2 and 3, respectively, offer little or no improvement in density due, at least in part, to the inherent limitations of the processing equipment and associated methodologies. Hence, there is a need to offer a manufacturing method that can continue to scale to higher density structures (e.g., deep, narrow, high aspect ratio trenches) which offer improved cost and super junction device performance. As will be described in further detail below, embodiments of the invention advantageously address deficiencies present in conventional devices and/or fabrication methodologies.

Figure 4:
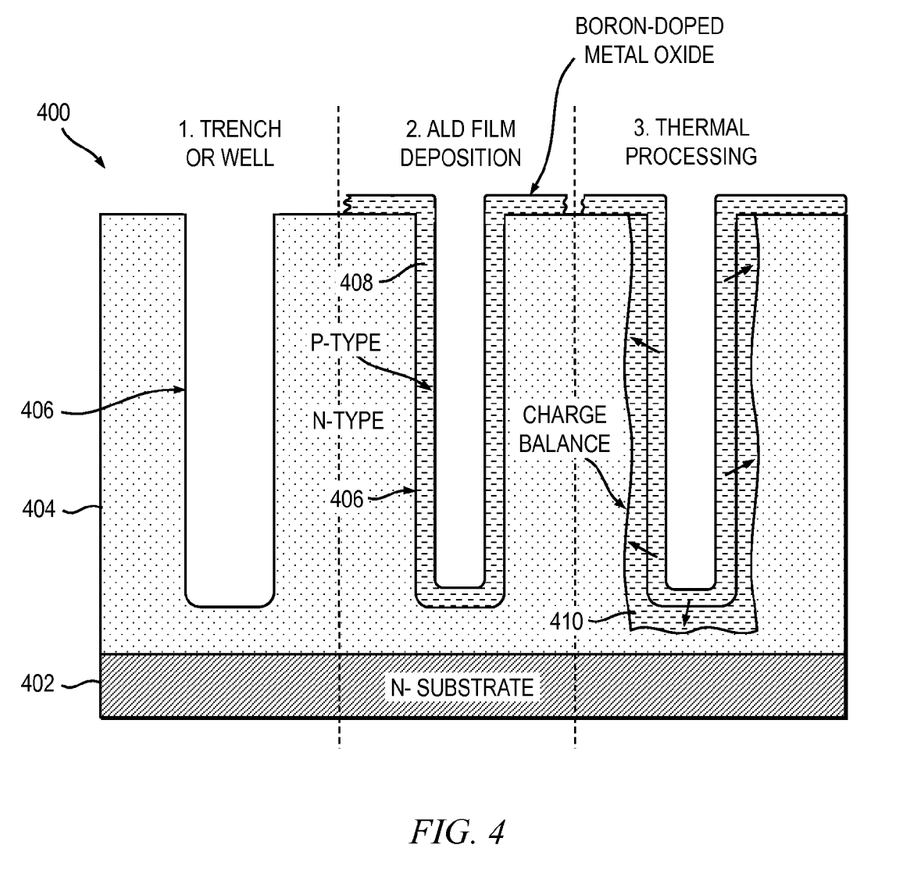
FIG. 4 is a cross-sectional view depicting at least a portion of an exemplary structure for creating charge balance in a semiconductor device, according to an embodiment of the present invention.

FIG. 4 is a cross-sectional view depicting at least a portion of an exemplary structure 400 for creating a charge balance region in an active semiconductor device (e.g., MOSFET, diode, insulated gate bipolar transistor (IGBT), etc.), according to an embodiment of the present invention. It is to be appreciated that the charge balance region formed in the device need not have a zero net charge. Rather, the net charge of the charge balance region can be set to a prescribed value, in accordance with one or more embodiments; that is, the charge balance region may be configured to exhibit a charge imbalance of a prescribed amount. The structure 400 is shown as including an evolution of three illustrative processing phases: a trench or well formation phase (1), a film deposition phase (2), and a thermal processing phase (3). Each of these phases will be described in further detail herein below.

With reference to FIG. 4, the structure 400 comprises a substrate 402 of a first conductivity type, which is N-type in this embodiment, and an epitaxial layer 404 of the first conductivity type formed on at least a portion of the substrate. The epitaxial layer 404, in this embodiment, is formed of N-type conductivity (like the substrate 402), although a P-type epitaxial layer may alternatively be employed.

The structure 400, in the first phase, comprises a plurality of recessed features, depicted as deep trenches 406 in this embodiment, formed at least partially through the epitaxial layer 404. The trenches 406 extend from an upper surface of the epitaxial layer 404, continuing through the epitaxial layer in a direction that is substantially perpendicular to a plane of the substrate 402 (i.e., a vertical dimension). The trenches 406 may be formed, for example, using reactive ion etching (RIE), or an alternative process, configured to achieve a desired aspect ratio (e.g., about 100:1), with spacing between adjacent trenches, referred to herein as pitch, that is relatively tight (e.g., about 1 µm); a tighter pitch beneficially reduces the size of the device and/or allows higher density circuitry to be fabricated in the device. A tighter pitch beneficially reduces the size of the device and/or allows higher density circuitry to be fabricated in the device.

In accordance with one or more embodiments of the invention, the trenches 406 are formed using an RIE process, with a spacing between adjacent trenches (i.e., pitch) of about 1 µm, although embodiments of the invention are not limited to any particular spacing. While embodiments of the invention are not limited to any specific depth or width of the trenches 406, for an illustrative device with a 600-volt breakdown voltage rating, trenches 406 are configured having a depth of about 30 µm or greater and a width of about 1 µm or less. Furthermore, it is to be appreciated that embodiments of the invention are not limited to any particular number of trenches 406 formed in the structure 400.

In the second fabrication phase, material is deposited on a bottom and/or sidewalls of at least a subset of the trenches 406. Rather than using a standard trench refill process, which is susceptible to defects (e.g., voids, pinholes, cracks, etc.), particularly when the aspect ratio is greater than a prescribed value, embodiments of the invention utilize atomic layer deposition (ALD) to deposit material (e.g., a dielectric film) on a bottom and/or sidewalls of each of at least a subset of the trenches 406. In a standard trench refill process, which utilizes, for example, chemical vapor deposition (CVD), depositing material on the sidewalls and bottom of a trench becomes significantly more challenging, if not unfeasible, as the depth of the trench increases. ALD is a method for depositing a diverse group of materials a single atomic layer at a time using relatively low temperatures (e.g., ambient to about 400 degrees Celsius (° C.)) on a variety of substrate materials. This approach provides several important benefits for forming a charge balance region in a semiconductor device, some of which are described herein below.

Using sequential, self-limiting surface reactions, ALD is able to achieve precise thickness control at an Angstrom (Å) or monolayer level. Most ALD processes are based on binary reaction sequences where two surface reactions occur and deposit a binary compound film. Because there are only a finite number of surface sites, the reactions can only deposit a finite number of surface species. Assuming each of the two surface reactions is self-limiting, the two reactions may proceed in a sequential fashion to deposit a thin film with atomic level control. The self-limiting nature of ALD leads to excellent step coverage and is fully conformal on high aspect ratio structures, such as on the bottom and sidewalls of the trenches 406. Moreover, the ALD process can be integrated with a standard semiconductor fabrication process without impacting other semiconductor fabrication steps that are temperature sensitive.

More particularly, once the deep trenches 406 are formed, an ALD step is used to deposit a film 408 containing elements of a second conductivity type, which in this embodiment is of P-type conductivity, on the bottom and/or sidewalls of each of at least a subset of the trenches. Prior to depositing the film 408 directly on the bottom and/or sidewalls of the trenches 406 using ALD, an etch step (e.g., hydrogen fluoride (HF), or hydrofluoric acid, etch) may be performed to remove any native oxide on the surfaces (e.g., bottoms and sidewalls) of the trenches resulting, for example, from exposure of the trench surfaces to an oxygen-bearing environment. In one or more embodiments, the deposited film 408 is a dielectric material, such as, but not limited to, a metal oxide (e.g., boron trioxide ($B_2O_3$)). When used with ALD, a metal oxide can be deposited on the bottom and sidewalls of the trenches 406, even when high aspect ratio trenches are used. It is to be appreciated that other suitable materials for achieving a prescribed charge balance in the structure 400 may be similarly employed.

In the third fabrication phase, rapid thermal processing (RTP), for example at a temperature of about 900 degrees Celsius for about one minute, is used to disassociate a dopant in the film 408 (e.g., boron, in the case of a boron-doped metal oxide film) deposited on the bottom and sidewalls of the trenches 406 and to drive the dopant into the epitaxial layer 404 through diffusion (i.e., out-diffusion). Specifically, during RTP, the elevated temperature causes the dopant in the deposited film 408 on the bottom and/or sidewalls of the trenches 406 to locally out-diffuse from the trenches into the epitaxial layer 404 proximate the trenches. As a result of the thermal processing, the dopant will form a doped region 410 of the second conductivity type (P-type conductivity in this illustrative embodiment) in the epitaxial layer 404 proximate the trenches 406. The doped region 410 will follow a contour of the trenches 406 in the epitaxial layer 404. In this manner, the doped region 410, in conjunction with the epitaxial region 404 between the trenches 406, will form alternating P-type and N-type columns, forming the charge balance region in the device. Because the mechanism for forming the doped region 410 surrounding each of the trenches 406 relies primarily on diffusion, which is highly controllable, a more precise degree of charge balancing in the structure 400 can be achieved compared to commercially available processes for fabricating a charge balance region.

After thermal processing, the trenches 406 are optionally filled, such as, for instance, by using a trench fill process or alternative fill step, with essentially any material suitable for providing structural integrity of the trenches, such as, for example, an oxide (e.g., silicon dioxide). Unlike in standard charge balance structures, the material filling the trenches is not used to provide the columns of alternating P-type and N-type conductivity. Rather, in accordance with embodiments of the invention, the trenches 406 are merely used as a mechanism for facilitating the deposition of exacting materials levels and out-diffusion of the dopant material (e.g., boron) deposited on the bottom and sidewalls of the trenches. Consequently, it is not critical that the trenches be filled in a void-free or defect-free manner; that is, the yield is not affected by the number of defects in the trench fill step (when used).

Figure 5:
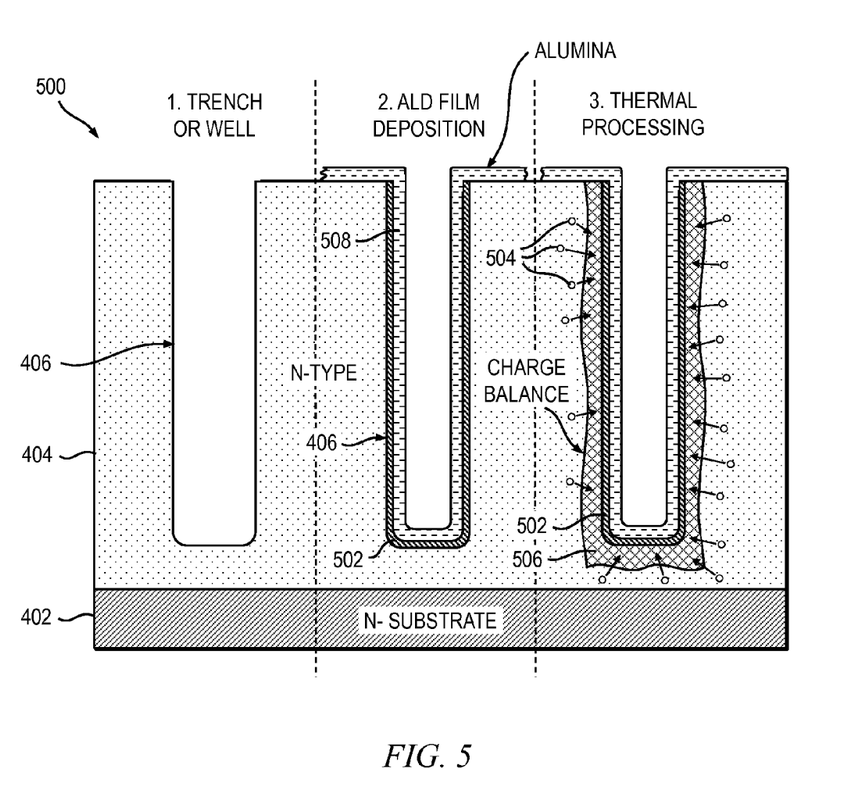
FIG. 5 is a cross-sectional view depicting at least a portion of an exemplary structure for creating charge balance in a semiconductor device, according to another embodiment of the present invention.

FIG. 5 is a cross-sectional view depicting at least a portion of an exemplary structure 500 for creating a charge balance region in a semiconductor device, according to another embodiment of the invention. The structure 500 is similar with regard to the first and second fabrication phases as illustrative structure 400 shown in FIG. 4, except that the mechanism by which the charge balance region is formed is different. Specifically, in accordance with one or more embodiments, the bottom and sidewalls of the trenches 406 include an insulating layer 502 formed thereon, such as, for example, silicon dioxide ($SiO_2$). The insulating layer 502 may be deposited on the bottom and sidewalls of the trenches 406, or, in one or more alternative embodiments, native oxide (e.g., silicon dioxide) formed (e.g., grown, such as by using an oxidation process) on the exposed surfaces of the trenches 406 can be used as the insulating layer.

The film 508 is deposited on the insulating layer 502, rather than being deposited directly on the bottom and sidewalls of the trenches 406 (as in the structure 400 shown in FIG. 4), using ALD. This insulating layer 502 prevents the dopant (e.g., aluminum) in the film 508 from locally out-diffusing into the epitaxial layer 404 during thermal processing. In one or more embodiments, the film 508 comprises alumina material (e.g., $Al_2O_3$). The alumina film 508 is deposited on the insulating layer 502 on the bottoms and sidewalls of at least a subset of the trenches 406. Alumina material has a negative surface charge property which is suitable for attracting positive charge carriers to a region proximate the bottom and sidewalls of the trenches 406, thereby achieving charge balance in the structure 500. When used with ALD, alumina is able to be deposited on the bottom and sidewalls of the trenches 406, even when high aspect ratio trenches (e.g., about 100:1 or greater) are used. It is to be appreciated that other suitable materials for achieving a prescribed charge balance in the structure 500 may be similarly employed.

More particularly, with reference to FIG. 5, the epitaxial layer 404 inherently includes free charge carriers 504 of a first charge type, which is positive in this illustrative embodiment. The film 508 deposited on the insulating layer 502 on the surfaces of the trenches 406 has a net static charge of a second charge type associated therewith, the second charge type being opposite in polarity to the first charge type; in this example, a negative static charge. Instead of the dopant in the deposited film 508 out-diffusing into the epitaxial later 404, the thermal processing in structure 500 (third fabrication phase) is configured such that at least a portion of the free charge carriers 504 in the epitaxial layer 404 (having a positive charge) migrate towards the deposited film 508 (having a negative charge) to thereby form a charge balance region 506 in the epitaxial layer proximate the trenches 406.

In a manner consistent with the embodiment shown in FIG. 4, after thermal processing, the trenches 406 can be filled, using a trench fill process or alternative fill step, with essentially any material suitable for providing structural integrity of the trenches, such as, for example, an oxide (e.g., silicon dioxide). Unlike in a standard charge balance structure, the material filling the trenches is not used to directly provide the columns of alternating P-type and N-type conductivity. Rather, in accordance with embodiments of the invention, the trenches 406 are merely used to facilitate the deposition of materials on the bottom and sidewalls of the trenches and the resulting attraction of free carriers in the epitaxial layer to a region surrounding a contour of the trenches. Hence, it is not critical that the trenches be filled in a void-free or defect-free manner.

Charge balance between the deposited film 508 and the N-type epitaxial region 404 in the formation of the charge balance region 506 in structure 500 is controlled as a function of a percentage of the material 508 deposited in the trenches 406, as well as thermal processing duration (i.e., time), atmosphere and/or temperature, among other parameters. An important advantage of the methodology according to one or more embodiments of the invention is that ALD is a more tightly controlled process compared to the methods previously discussed, as may be used in the fabrication of conventional charge balanced structures, and therefore the respective dimensions of the alternating regions of P-type and N-type material used for providing charge balance in the device can be a smaller pitch, which improves device cost and performance.

Figure 6:
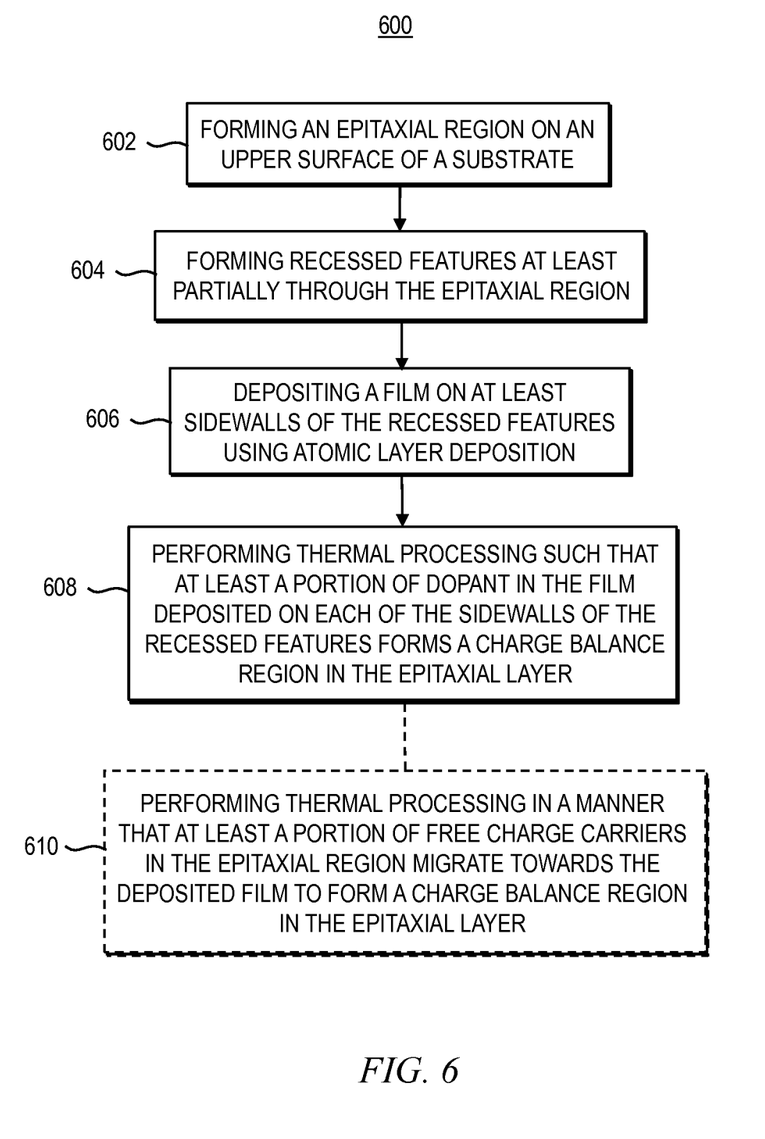
FIG. 6 is a flow diagram depicting at least a portion of an exemplary method of forming a charge balance region in an active semiconductor device, according to embodiments of the present invention.

FIG. 6 is a flow diagram depicting at least a portion of an exemplary method 600 of forming a charge balance region in an active semiconductor device, according to an embodiment of the invention. It is to be understood that method 600 does not include all steps necessary in fabricating a semiconductor device, as will become apparent to those skilled in the art. Rather, basic steps relating to forming a charge balance region are presented, as described above in further detail. Illustrative embodiments of structures formed in accordance with method 600 are shown in FIGS. 4 and 5.

With reference to FIG. 6, in step 602, an epitaxial region of a first conductivity type is formed on an upper surface of a substrate. In step 604, recessed features are formed at least partially through the epitaxial region. In accordance with embodiments of the invention, the recessed features may be in the form of deep trenches, wells, stepped features, etc., having a high aspect ratio (e.g., greater than about 2:1, and more preferably greater than about 20:1). In step 606, a film is deposited on a bottom and/or sidewalls of the recessed features using ALD. As previously stated, the film is preferably deposited directly on exposed surfaces of the recessed features. During processing, a passivation layer or native oxide layer (e.g., silicon dioxide) may form (e.g., through oxidation) on exposed surfaces of the recessed features. Thus, to enable the film to be deposited directly on the bottom and/or sidewalls of the recessed features, this passivation layer is removed, in one or more embodiments, using an etchant composition (e.g., HF etch) or an alternative etching process, as will become apparent to those skilled in the art. This passivation layer removal process is incorporated into step 606, in one or more embodiments, and is performed prior to depositing the film using ALD.

In step 608, thermal processing (e.g., rapid thermal processing) is performed such that at least a portion of dopant in the film deposited on the bottom and/or sidewalls of the recessed features forms a charge balance region in the epitaxial layer by a process of diffusion, as previously noted in conjunction with FIG. 4. Method 600 may, alternatively, perform step 610 in place of step 608 as a mechanism for forming the charge balance region. Specifically, in the case of the exemplary structure 500 shown in FIG. 5, wherein the charge balance region is formed without relying on out-diffusion of the dopant into the epitaxial layer from the recessed features, step 610, as an alternative to step 608, performs thermal processing in a manner that at least a portion of free charge carriers in the epitaxial region migrate towards the deposited film in the recessed features to form the charge balance region in the epitaxial layer proximate the recessed features.

When the mechanism according to step 610 is used to form the charge balance region, it is contemplated that step 606, in one or more embodiments, incorporates an additional step of forming an insulating layer (e.g., layer 502 in FIG. 5) on exposed surfaces (e.g., bottom and/or sidewalls) of the recessed features. The film is then deposited on the insulating layer on the bottom and/or sidewalls of the recessed features, using ALD, so as to prevent the dopant in the film from out-diffusing into the epitaxial layer during thermal processing, as previously stated.

Additional processing steps not explicitly shown but implied, including, for example, the formation of one or more anode and cathode regions, source and drain regions, collector and emitter regions, etc., are subsequently performed, depending on the type of active device being formed, including, for example, a diode, field-effect transistor, and/or bipolar transistor, respectively, as will be known by those skilled in the art.

The illustrations of embodiments of the invention described herein are intended to provide a general understanding of the structure of various embodiments, and they are not intended to serve as a complete description of all the elements and features of apparatus and systems that might make use of the structures described herein. Many other embodiments will become apparent to those skilled in the art given the teachings herein; other embodiments are utilized and derived therefrom, such that structural and logical substitutions and changes can be made without departing from the scope of this disclosure. The drawings are also merely representational and are not drawn to scale. Accordingly, the specification and drawings are to be regarded in an illustrative rather than a restrictive sense.

Embodiments of the invention are referred to herein, individually and/or collectively, by the term "embodiment" merely for convenience and without intending to limit the scope of this application to any single embodiment or inventive concept if more than one is, in fact, shown. Thus, although specific embodiments have been illustrated and described herein, it should be understood that an arrangement achieving the same purpose can be substituted for the specific embodiment(s) shown; that is, this disclosure is intended to cover any and all adaptations or variations of various embodiments. Combinations of the above embodiments, and other embodiments not specifically described herein, will become apparent to those of skill in the art given the teachings herein.

The abstract is provided to comply with 37 C.F.R. §1.72(b), which requires an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the appended claims reflect, inventive subject matter lies in less than all features of a single embodiment. Thus the following claims are hereby incorporated into the Detailed Description, with each claim standing on its own as separately claimed subject matter.

Given the teachings of embodiments of the invention provided herein, one of ordinary skill in the art will be able to contemplate other implementations and applications of the techniques of embodiments of the invention. Although illustrative embodiments of the invention have been described herein with reference to the accompanying drawings, it is to be understood that embodiments of the invention are not limited to those precise embodiments, and that various other changes and modifications are made therein by one skilled in the art without departing from the scope of the appended claims.

What is claimed is:

1. A method of forming a charge balance region in an active semiconductor device, the method comprising:
    forming an epitaxial region comprising material of a first conductivity type on an upper surface of a substrate of the semiconductor device;
    forming a plurality of recessed features at least partially through the epitaxial region;
    depositing a film comprising material of a second conductivity type on at least one of a bottom and sidewalls of the recessed features using atomic layer deposition; and
    performing thermal processing such that at least a portion of the film deposited on each of the sidewalls of the recessed features forms a region of the second conductivity type in the epitaxial region which follows a contour of the recessed features, the region of the second conductivity type, in conjunction with the epitaxial region proximate the region of the second conductivity type, forming the charge balance region.

2. The method of claim 1, wherein the material of the first conductivity type is N-type material and the material of the second conductivity type is P-type material.

3. The method of claim 1, wherein the material of the first conductivity type is P-type material and the material of the second conductivity type is N-type material.

4. The method of claim 1, wherein the film deposited on at least one of the bottom and sidewalls of the recessed features comprises a metal oxide.

5. The method of claim 4, wherein the metal oxide comprises at least one of aluminum oxide ($Al_2O_3$) and boron trioxide ($B_2O_3$).

6. The method of claim 1, wherein each of at least a subset of the plurality of recessed features is formed having a depth through the epitaxial region that is at least two times greater than a width thereof.

7. The method of claim 1, wherein the active semiconductor device comprises at least one of a field-effect transistor, a schottky diode, a unipolar diode, a bipolar transistor, a bipolar diode, and an insulated gate bipolar transistor, and wherein the charge balance region forms a drift region in the at least one of the field-effect transistor, a schottky diode, a unipolar diode, a bipolar transistor, a bipolar diode, and an insulated gate bipolar transistor.

8. The method of claim 1, wherein each of at least a subset of the plurality of recessed features is formed at least partially through the epitaxial region in a direction substantially perpendicular to a plane of the substrate.

9. The method of claim 1, wherein each of at least a subset of the plurality of recessed features remains at least partially unfilled.

10. The method of claim 1, wherein forming each of at least a subset of the plurality of recessed features comprises forming at least one of a trench, a well, and a stepped structure in the epitaxial region.

11. The method of claim 1, further comprising controlling impact ionization of the charge balance region by controlling a depth of the recessed features in the device.

12. The method of claim 1, further comprising controlling impact ionization of the charge balance region by controlling at least one of an atmospheric condition and a duration of the thermal processing to thereby control at least one of a width and a doping concentration of the region of the second conductivity type formed in the epitaxial region of the device.

13. The method of claim 1, wherein depositing the film on at least sidewalls of the recessed features comprises depositing at least one of a dopant and a dielectric material on at least sidewalls of at least a subset of the recessed features.

14. The method of claim 1, wherein performing thermal processing comprises rapid thermal processing.

15. The method of claim 1, further comprising controlling at least one of an impurity concentration of the epitaxial region of the first conductivity type, an impurity concentration of at least a portion of the region of the second conductivity type, a volume of the region of the second conductivity type and a volume of the epitaxial region to thereby control a charge balance between the epitaxial region and the region of the second conductivity type.

16. The method of claim 15, further comprising substantially matching a charge associated with the epitaxial region proximate at least a portion of the region of the second conductivity type with a charge associated with the region of the second conductivity type.

17. The method of claim 15, further comprising creating a charge imbalance of a prescribed amount between the epitaxial region proximate at least a portion of the region of the second conductivity type and the region of the second conductivity type.

18. The method of claim 1, wherein forming at least a subset of the plurality of recessed features comprises forming at least a subset of the plurality of recessed features using reactive ion etching.

19. The method of claim 1, further comprising controlling a spacing between the plurality of recessed features such that the region of the second conductivity type is interleaved with the epitaxial region so as create alternating regions of first and second conductivity types throughout at least a portion of the epitaxial region.

20. The method of claim 19, wherein a pitch between adjacent recessed features is less than about ten microns.

21. The method of claim 1, wherein depositing the film comprising material of the second conductivity type on at least sidewalls of the recessed features comprises depositing the film on an insulating layer formed on at least sidewalls of at least a subset of the plurality of recessed features.

22. The method of claim 1, wherein depositing the film comprising material of the second conductivity type on at least sidewalls of the recessed features comprises:
    removing an oxide layer formed on at least the sidewalls of at least a subset of the plurality of recessed features; and
    depositing the film directly on at least the sidewalls of at least a subset of the plurality of recessed features.

23. A method of forming a charge balance region in an active semiconductor device, the method comprising:
    forming an epitaxial region comprising material of a first conductivity type on an upper surface of a substrate of the semiconductor device, the epitaxial region including charge carriers of a first charge type;
    forming a plurality of recessed features at least partially through the epitaxial region;

forming an insulating layer on at least one of a bottom and sidewalls of each of at least a subset of the recessed features;

depositing a film on at least a portion of the insulating layer on at least one of the bottom and sidewalls of each of at least the subset of the recessed features using atomic layer deposition, the film having a net static charge of a second charge type associated therewith, the second charge type being opposite in polarity to the first charge type; and performing thermal processing in such a manner that at least a portion of the charge carriers of the first charge type in the epitaxial region migrate towards the deposited film to thereby form the charge balance region in the epitaxial region.

24. A semiconductor device, comprising:

a substrate;

an epitaxial region formed on a surface of the substrate, the epitaxial region including intrinsic charge carriers of a first charge type;

a plurality of recessed features formed at least partially through the epitaxial region, at least one of a bottom and sidewalls of each of at least a subset of the plurality of recessed features having deposited thereon, using atomic layer deposition, a dielectric film comprising material having a net static charge of the first charge type; and a charge balance region formed in the epitaxial region, the charge balance region comprising a first region including charge carriers of a second charge type that migrated from the epitaxial region towards the dielectric film during thermal processing of the semiconductor device, and a second region of the first charge type comprising the intrinsic charge carriers of the first charge type in the epitaxial region, the second charge type being opposite in polarity to the first charge type.

25. A method of forming a charge balance region in an active semiconductor device, the method comprising:

forming an epitaxial region on a surface of a substrate of the semiconductor device, the epitaxial region including charge carriers of a first charge type;

forming a plurality of recessed features at least partially through the epitaxial region;

depositing a film on at least one of a bottom and sidewalls of each of at least a subset of the recessed features using atomic layer deposition, the film having a net static charge of a second charge type associated therewith, the second charge type being opposite in polarity to the first charge type; and performing thermal processing in such a manner that at least a portion of the charge carriers of the first charge type in the epitaxial region migrate towards the deposited film to thereby form the charge balance region in the epitaxial region.

26. A method of forming a charge balance region in an active semiconductor device, the method comprising:

forming an epitaxial region on a substrate of the semiconductor device;

forming a plurality of recessed features at least partially through the epitaxial region;

depositing a film on at least one of a bottom and sidewalls of each of at least a subset of the recessed features using atomic layer deposition; and performing thermal processing such that at least a portion of the film deposited on each of at least one of the bottom and sidewalls of the recessed features forms a first region in the epitaxial region having a charge that is opposite in polarity to an intrinsic charge of the epitaxial region, the first region, in conjunction with a portion of the epitaxial region proximate the first region, forming the charge balance region.

27. The method of claim 26, wherein depositing the film comprises depositing the film on an insulating layer formed on at least one of the bottom and sidewalls of at least the subset of the plurality of recessed features.

28. A semiconductor device, comprising:

a substrate;

an epitaxial region of a first conductivity type formed on a surface of the substrate;

a plurality of recessed features formed at least partially through the epitaxial region, at least one of a bottom and sidewalls of each of at least a subset of the plurality of recessed features having deposited thereon, using atomic layer deposition, boron trioxide; and a first region of a second conductivity type formed in the epitaxial region proximate the recessed features, the first region including boron from the boron trioxide deposited on at least one of the bottom and sidewalls of at least the subset of the recessed features that has diffused into the epitaxial region during thermal processing of the semiconductor device, said first region, in conjunction with the epitaxial region, forming a charge balance region in the semiconductor device.

* * * * *